US008633457B2

(12) United States Patent
Nasser-Ghodsi et al.

(10) Patent No.: US 8,633,457 B2
(45) Date of Patent: Jan. 21, 2014

(54) BACKGROUND REDUCTION SYSTEM INCLUDING LOUVER

(75) Inventors: Mehran Nasser-Ghodsi, Hamilton, MA (US); Christopher Sears, Fremont, CA (US); Robert Haynes, Pleasanton, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 392 days.

(21) Appl. No.: 13/174,020

(22) Filed: Jun. 30, 2011

(65) Prior Publication Data

US 2013/0001417 A1    Jan. 3, 2013

(51) Int. Cl.
*A61N 5/00* (2006.01)
*G21G 5/00* (2006.01)

(52) U.S. Cl.
USPC ........ 250/492.1; 250/306; 250/307; 250/310; 250/311; 250/492.2; 250/398; 250/492.3

(58) Field of Classification Search
USPC ........... 250/306, 307, 310, 311, 492.1, 492.2, 250/398
See application file for complete search history.

(56) References Cited

U.S. PATENT DOCUMENTS

| 5,994,709 A * | 11/1999 | Suzuki ................. 250/492.23 |
| 7,692,156 B1 * | 4/2010 | Nagarkar ............... 250/370.11 |
| 2008/0240535 A1 * | 10/2008 | Frangioni et al. ............. 382/131 |
| 2010/0288946 A1 * | 11/2010 | Honda et al. ............... 250/492.3 |

FOREIGN PATENT DOCUMENTS

| SU | 693487 A1 | 10/1979 |
| SU | 184427 A1 | 4/1995 |

* cited by examiner

*Primary Examiner* — Jack Berman
*Assistant Examiner* — Meenakshi Sahu
(74) *Attorney, Agent, or Firm* — Suiter Swantz pc llo

(57) ABSTRACT

A background reduction system may include, but is not limited to: a charged particle source configured to generate a charged-particle beam; a louvered structure including one or more apertures configured to selectively transmit charged particles according to their angle of incidence; and a charged-particle detector configured to receive charged particles selectively transmitted by the louvered structure.

16 Claims, 5 Drawing Sheets

US 8,633,457 B2

BACKGROUND REDUCTION SYSTEM INCLUDING LOUVER

FIELD OF THE INVENTION

The present disclosure relates to reducing background noise in particle detectors by angular transmission filtering with a louver.

BACKGROUND

When a charged particle strikes a surface, the particle may be scattered back (possibly losing some energy to the surface); induce the emission of a secondary particle (either ion or electron), or cause the release of a photon from the surface. From these outgoing (hereafter secondary) particles, characteristics of the surface can be determined, for example physical structure or material composition. The secondary particles can also, in turn, strike other surfaces inside an experiment, leading to tertiary emission and so forth. Since in many measurements, only the first surface is of interest, emission from other surfaces constitutes an unwanted background to the measurement.

As a specific example, the composition of a surface can be determined by studying Auger emitted electrons. Auger electrons can be observed by looking at the energy spectrum of the particles leaving the surface struck by a primary beam. The energy spectrum is measured by an energy dispersive analyzer: for example a hemispherical or cylindrical mirror analyzers or magnetic sector, to name a few. These devices observe a window of energies and exit angles from the surface. However, electrons from other surfaces outside or sometime inside the analyzer can be generated and reach the detector plane of the analyzer.

SUMMARY

A charged-particle scanning system may include, but is not limited to: a charged particle source configured to generate a charged-particle beam; a louvered structure including one or more apertures configured to selectively transmit charged particles according to their angle of incidence; and a charged-particle detector configured to receive charged particles selectively transmitted by the louvered structure.

DETAILED DESCRIPTION

During particle detection operations such as those performed in electron scattering detection processes for semiconductor wafer certification it may be the case that secondary and tertiary scattering outside or inside the detector may constitute a significant contribution to an overall detected signal, thereby necessitating long integration times and substantial back-end processing of detected signals to reduce the signal-to-noise ratio to allowable levels. The below described systems and methods provide various mechanisms for reducing the level of background emissions presented to the detector of particle detection system.

Figure 1:
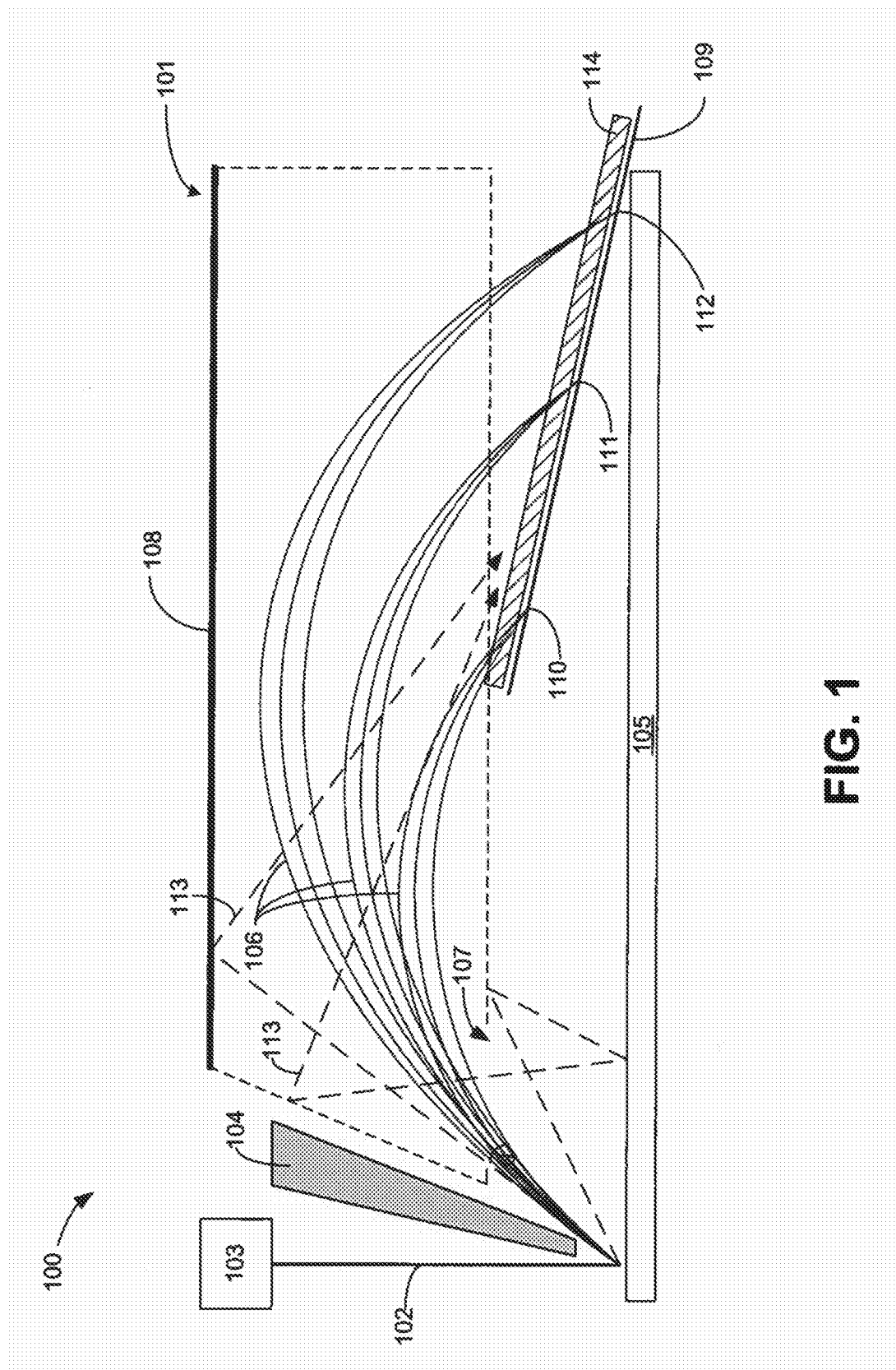
FIG. 1 is a cross-sectional diagram depicting components of a background reduction system.

In FIG. 1, a cross-sectional diagram depicting components of a scanning detection system 100 which includes an energy analyzer 101 is illustrated. As shown, a charged-particle beam 102 (e.g. an electron beam) originates from an charged-particle source 103 (e.g. an electron gun) and travels down an optical axis and through an objective lens 104 to become focused upon the surface of a target substrate 105.

The energy analyzer 101 is positioned to detect secondary charged particles emitted from the target substrate 105 due to the impingement of the charged-particle beam 102 on the target substrate 105.

Charged-particle trajectories 106 are depicted for secondary charged particles emitted from the target substrate 105 following impingement of the charged-particle beam 102 on the target substrate 105. As indicated, the secondary charged particles whose trajectories 106 are within a certain range of polar angles θ may pass through an entrance aperture 107.

The trajectories 106 of the charged particles may be deflected away from an electrode 108. The deflected charged particles may impinge upon a detector 109.

In a particular example the detector 109 may be a position-sensitive detector 109. Higher-energy charged particles travel farther and impinge upon the detector 109 at positions farther away from a z-axis defined by the charged-particle beam 102. For purposes of illustration, FIG. 1 depicts the trajectories of charged particles with various initial polar angles θ (e.g. about 30 degrees) but with one of three example energy levels. The charged particles at the lower energy level land at a closer radial position 110 along the detector 109. The charged particles at the middle energy level land at a middle radial position 111 along the detector 109. Finally, the charged particles at the higher energy level land at a farther radial position 112 along the detector 109. The detector 109 may be configured to detect such positions (e.g. through a matrix of detector cells) to provide position-dependent data to a back-end processing device for analysis. The trajectories 106 of the charged particles may be such that the charged particles take a substantially uninterrupted path (e.g. do not reflect off of any surface) between the target substrate 105 and the detector 109.

As described above, it may be the case that background emissions may constitute a significant contribution to an overall detected signal, thereby necessitating long integration times and substantial back-end processing of detected signals to reduce the signal-to-noise ration to allowable levels. For example, as shown in FIG. 1, background emissions 113 (e.g. charged particles not emanating from the impingement of the charged-particle beam 102 on the target substrate 105, charged particles emanating from the impingement of the charged-particle beam 102 on the target substrate 105 that reflect off an intervening surface between the target substrate 105 and the detector 109, and the like) may be present within the energy analyzer 101.

In order to reduce the amount of background emissions 113 which reach the detector 109, the system 100 may include a louver structure 114 which may be configured to allow only particles having trajectories 106 within a defined angle of acceptance relative to the louver structure 114 to reach the detector 109.

Figure 2:
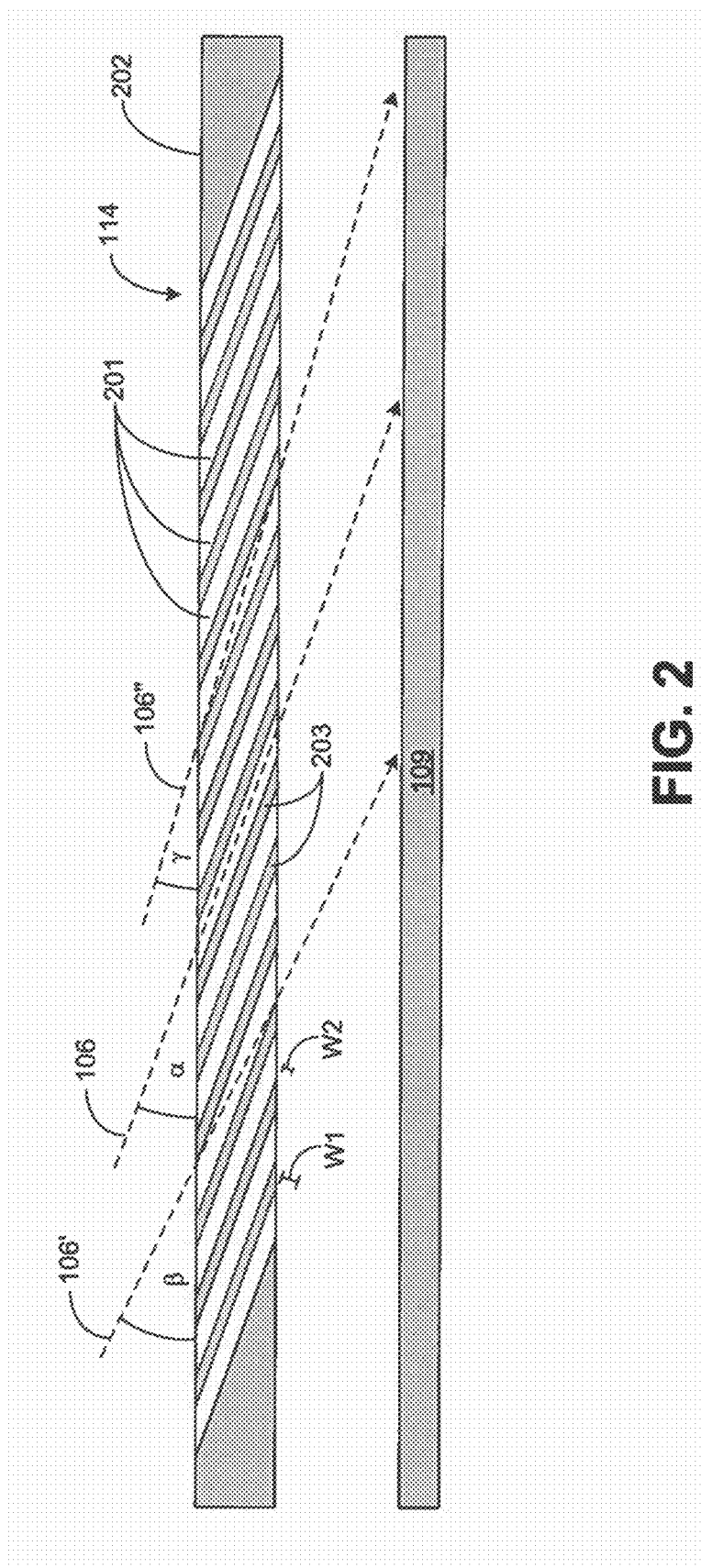
FIG. 2 is a cross-sectional diagram depicting a louver.
Figure 3:
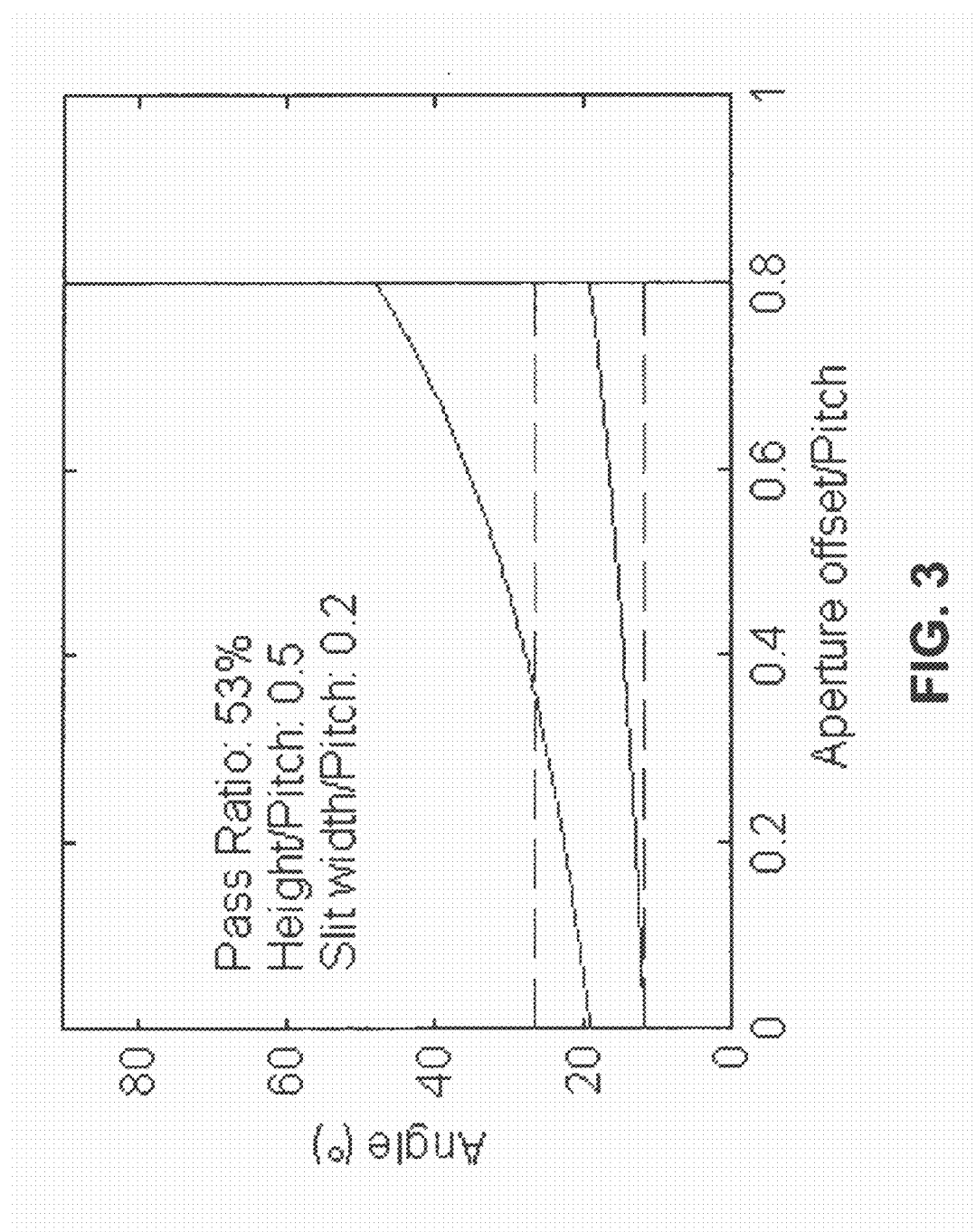
FIG. 3 is a plot of transmittance window of an example louver for background reduction. The figure overlays the aperture transmission window with that of the louver.

For example, as shown in FIG. 2, the louver structure 114 may be a substantially planar structure. The louver structure 114 may include one or more apertures 201 through a main body portion 202 of the louver structure 114 thereby allowing particles having varying trajectories 106 to pass through the louver structure 114. The apertures 201 may be defined by one or more louver bars 203. The size and spacing of the apertures 201 and/or louver bars 203 may be configured to specify a desired angle of acceptance for such particles. For example, as shown in FIG. 2, the apertures 201 may be configured parallel an angle of incidence α (e.g. from about 10 to 50 degrees) associated with a desired trajectory 106. The apertures 201 of the louver structure 114 may have an apparent width W1 (e.g. from about 0.010 to 0.015 inches or, more particularly, about 0.013 inches) while louver bars 203 of the louver structure 114 may have an apparent width W2 (e.g. from about 0.002 to about 0.006 inches and, more particularly, about 0.004 inches) such that particles having trajectories 106 between an angle β and an angle γ (e.g. trajectories 106' and 106") may be transmitted by the louver structure 114 while particles having trajectories less than β or greater than γ will be reflected and/or absorbed by the louver structure 114. In a specific example, an entrance band for the apertures 201 may be specified where α is approximately 30 degrees relative to the surface of the louver structure 114 and β and γ are +/−7.5 degrees, respectively, about α. Such an entrance band may result in a particle transmission ratio of approximately 53% (as detailed in FIG. 3).

Figure 4:
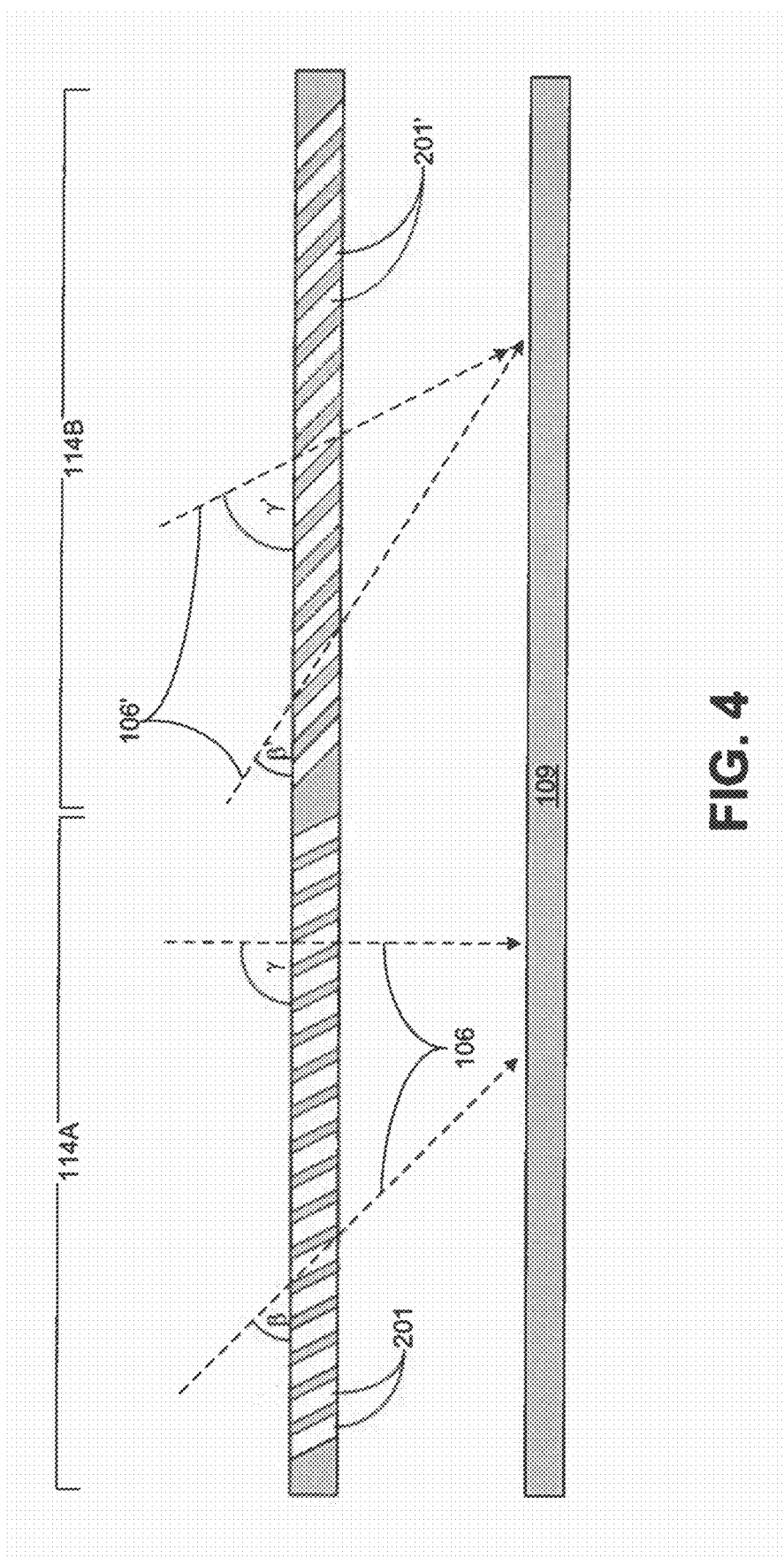
FIG. 4 is a cross-sectional diagram depicting a louvered portion of a background reduction system including apertures having a first angle of acceptance and apertures having a second angle of acceptance.

In another example, the angles of acceptance of the apertures 201 of the louver structure 114 may vary across the louver structure 114 in order to accept particles of differing trajectories 106 at various portions of the louver structure 114. For example, as shown in FIG. 4, a first portion 114A of the louver structure 114 may have apertures 201 sized such that particles having trajectories 106 between an angle β and an angle γ (with respect to the surface of the louver structure 114) may pass through the louver structure 114 while particles having trajectories less than β or greater than γ (e.g. background emissions 113) will be reflected by the louver structure 114. Further, a second portion 114B of the louver structure 114 may have apertures 201' configured such that particles having trajectories 106' between an angle β' and an angle γ' (where β' or γ' of portion 114B is different than β or γ, respectively, of portion 114A) may pass through the louver structure 114 while particles having trajectories less than β' or greater than γ' (e.g. background emissions 113) will be reflected and/or absorbed by the louver structure 114.

Figures 5A, 5B:
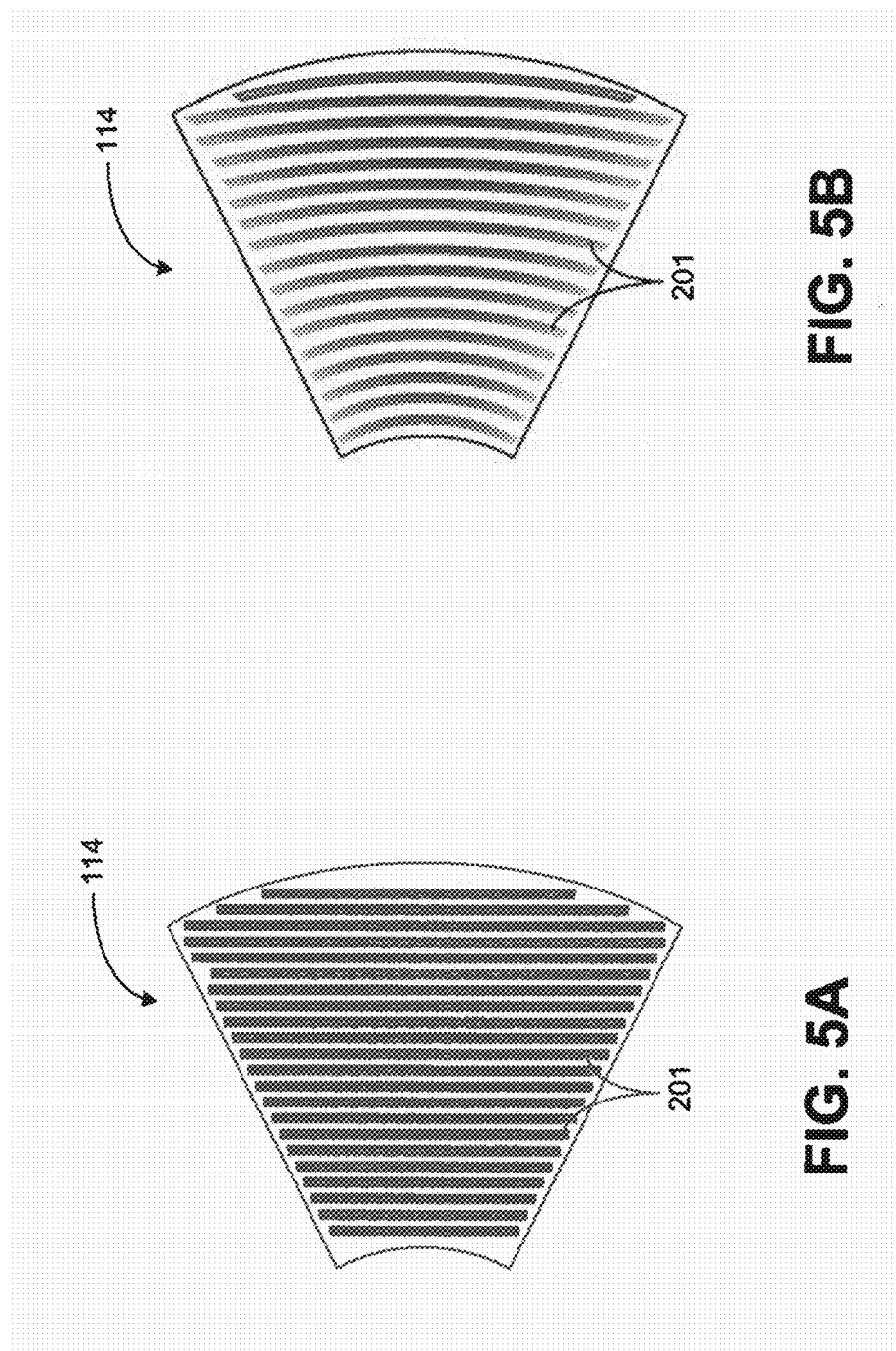
FIG. 5A shows a top view of a louvered portion of a background reduction system including substantially linear apertures.
FIG. 5B shows a top view of a louvered portion of a background reduction system including substantially arcuate apertures.

In another example, as shown in FIG. 5A, the apertures 201 may be substantially linear in shape and be disposed across the louver structure 114 in a substantially parallel manner. In another example, as shown in FIG. 6B, the apertures 201 at least partially arcuate in shape (e.g. in a semi-circular shape with respect to the z-axis defined by the charged-particle beam 102) and disposed across the louver structure 114 in a substantially parallel manner.

The louver structure 114 may be constructed from any material. Specifically, the louver structure 114 may be constructed from aluminum, stainless steel, titanium, and the like. Additionally, the louver structure 114 may further include one or more particle-absorbing coatings (e.g. a carbon sputter coating).

It will be noted that the above described background reduction methodologies may be applied to any number of particle detectors. For example, the methodologies may be applied to hyperbolic-field and magnetic bend energy analyzers.

The above-described diagrams are not necessarily to scale and are intended be illustrative and not limiting to a particular implementation. Specific dimensions and geometries will vary and depend on each implementation.

The above-described invention may be used in an automatic inspection system and applied to the inspection of wafers, X-ray masks and similar substrates in a production environment. While it is expected that the predominant use of the invention will be for the inspection of wafers, optical masks, X-ray masks, electron-beam-proximity masks and stencil masks, the techniques disclosed here may be applicable to the high speed surface analysis of any material (including possibly biological samples).

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

The invention claimed is:

1. A background reduction system comprising:
   a charged particle source configured to generate a charged-particle beam; and
   a louvered structure including one or more apertures configured to selectively transmit charged particles according to their angle of incidence;
   a charged-particle detector configured to receive charged particles selectively transmitted by the louvered structure.

2. The background reduction system of claim 1, wherein the angle of incidence is from about 10 degrees to about 50 degrees.

3. The background reduction system of claim 1, wherein the charged-particle beam is directed onto a target substrate.

4. The background reduction system of claim 1, wherein the louvered structure is configured for selectively transmitting secondary charged particles emitted from the target substrate.

5. The background reduction system of claim 1, wherein the louvered structure comprises a particle-absorbing composition.

6. The background reduction system of claim 1, wherein the particle-absorbing composition is a particle-absorbing coating of a base louvered substrate.

7. The background reduction system of claim 1, wherein the louvered structure includes a first portion including one or more apertures having a first angle of acceptance and a second portion including one or more apertures having a second angle of acceptance different than the first angle of acceptance.

8. The background reduction system of claim 1, wherein the charged-particle detector is a position-sensitive charged-particle detector.

9. The background reduction system of claim 1, wherein one or more apertures of the louvered structure are substantially linear in shape.

10. The background reduction system of claim 1, wherein one or more apertures of the louvered structure are at least partially arcuate in shape.

11. A method for background reduction comprising:
generating a charged-particle beam;
disposing a louvered structure in a path of one or more charged particles for selectively transmitting one or more charged particles according to an angle of incidence of the one or more charged particles; and
detecting one or more selectively transmitted charged particles.

12. The method of claim 11, wherein the angle of incidence is from about 10 degrees to about 50 degrees.

13. The method of claim 11, further comprising:
directing the charged-particle beam onto a target substrate.

14. The background reduction system method of claim 13, wherein the disposing a louvered structure in a path of one or more charged particles for selectively transmitting one or more charged particles generated by the charged-particle beam according to an angle of incidence of the one or more charged particles comprises:
disposing a louvered structure in a path of one or more secondary charged particles emitted from the target substrate for selectively transmitting the one or more secondary charged particles emitted from the target substrate according to an angle of incidence of the one or more secondary charged particles.

15. A system for background reduction system comprising:
means for generating a charged-particle beam;
means for disposing a louvered structure in a path of one or more charged particles for selectively transmitting one or more charged particles according to an angle of incidence of the one or more charged particles; and
means for detecting one or more selectively transmitted charged particles.

16. The method system of claim 15, wherein the angle of incidence is from about 10 degrees to about 50 degrees.

* * * * *